(12) United States Patent
Lin

(10) Patent No.: US 6,864,697 B1
(45) Date of Patent: Mar. 8, 2005

(54) FLIP-OVER ALIGNMENT STATION FOR PROBE NEEDLE ADJUSTMENT

(75) Inventor: Kuan-Min Lin, Taipei (TW)

(73) Assignee: Taiwan Semiconductor Manufacturing Co. Ltd, Hsin Chu (TW)

(*) Notice: Subject to any disclaimer, the term of this patent is extended or adjusted under 35 U.S.C. 154(b) by 0 days.

(21) Appl. No.: 10/636,949

(22) Filed: Aug. 6, 2003

(51) Int. Cl.[7] .......................... G01R 31/02; G01R 31/42
(52) U.S. Cl. ..................... 324/758; 324/756; 324/158.1
(58) Field of Search ......................... 324/758, 750–765, 324/158.1

(56) References Cited

U.S. PATENT DOCUMENTS 5,479,109 A * 12/1995 Lau et al. .................... 324/758
6,002,426 A * 12/1999 Back et al. .................... 348/87
6,025,729 A * 2/2000 Van Loan et al. .......... 324/755
6,429,671 B1 * 8/2002 Duckworth et al. ........ 324/758

* cited by examiner

Primary Examiner—Evan Pert
Assistant Examiner—Emily Y Chan
(74) Attorney, Agent, or Firm—Tung & Associates

(57) ABSTRACT

An alignment station for aligning probe needles on a probe card prior to testing of integrated circuits on a wafer. The alignment station includes a probe card support or chuck for receiving a probe card and mask carrier arms which support a needle alignment mask and are operable to selectively place the mask into contact with the probe needles and raise the mask out of contact with the probe needles.

20 Claims, 2 Drawing Sheets

FLIP-OVER ALIGNMENT STATION FOR PROBE NEEDLE ADJUSTMENT

FIELD OF THE INVENTION

The present invention relates to wafer probe cards used to test electrical characteristics of integrated circuits fabricated on semiconductor wafer substrates. More particularly, the present invention relates to a flip-over alignment station which includes a mask carrier that is operable to move a glass mask into and out of contact with an inverted wafer probe card in the alignment adjustment of probe needles on the card.

BACKGROUND OF THE INVENTION

A conventional method used by the semiconductor industry in the manufacturing of semiconductor integrated circuits includes the steps of fabrication, wafer sort, assembly and test, respectively. As shown in FIG. 1, in the fabrication step, as many as several thousand dies (integrated circuits) 5 are formed onto a semiconductor wafer 4. In the wafer sort step, each of the dies 5 on the wafer 4 is tested to determine its electrical characteristics and operability, and defective dies are distinguished from operable dies. The defective dies are often marked by an ink mark at the wafer sorting step. In the assembly step, the unmarked, operable dies are assembled into a package, and in the test step, the packaged integrated circuits are tested for operability and reliability.

At the water sort step, the dies are tested to establish which dies on the wafer function properly. Each die is tested to all functional product specifications for both DC and AC parameters. Four testing objectives are pursued: (1) chip functionality, in which all chip functions are tested to ensure that only fully-functional chips are assembled and packaged in subsequent steps; (2) chip sorting, in which chips are separated or sorted on the basis of their operating speed performance under various voltage and timing conditions; (3) fab yield response, which yields important information that may lead to improvements in the overall fabrication process; and (4) test coverage, in which high test coverage of the internal device nodes is achieved at the lowest possible cost. The wafer sort procedure is similar to the in-line parametric test except that every die on the wafer is tested, in many cases using the same automated test equipment (ATE). Furthermore, the wafer sort procedure is usually located in a separate facility under less stringent purity conditions than those in which the parametric test is carried out, since wafer fabrication is essentially complete.

In automated wafer handling during wafer sort, a correlation wafer is used to verify tester setup. The correlation wafer is a control wafer the functionality of which has been verified and ensures that the testing system is working properly. After indexing from the cassette to the prober, the wafers are mounted on a vacuum chuck with Z (vertical) positioning. Using software, mechanical probe needles are aligned and contacted with bond pads on the wafer to establish electrical communication between the testing equipment and the dies on the wafer. The probes are interfaced with the ATE to perform the range of AC functional tests based on test algorithms. The type, number and order of tests are defined by the test program.

After testing, die found to be defective are labeled in a computer database to exclude the die from subsequent packaging steps. The labeling method is typically performed by placing a drop of ink on each unacceptable die. Because the ink marking process can be messy and introduce possible contaminants onto the chip, electronic wafer maps are increasingly being used to create a computer image of chip location and test results to categorize good and bad die on the wafer. At the chip assembly stations, the electronic water maps are downloaded into an equipment database to ensure that defective chips will not be packaged.

As further shown in FIG. 1, in an integrated circuit pattern of each dice 5, the input, output, power supply and other terminals of the circuit are formed by multiple metalized contact pads 6, adjacent ones of which are usually deployed in lines along the periphery or margins of the pattern in what is commonaly known in the art as a testkey pattern. Metal lines or traces 7 electrically connect the contact pads 6 to the circuit elements of the dice 5. The outline of the testkey pattern is either square or rectangular, and the marginal locations of the contact pads thereon depend on the circuit configuration and the available marginal space. Thus, in a relatively simple circuit pattern, all of the marginal space may be available for contact pads, whereas in more complex circuits, portions of the circuit may invade the marginal areas so that contact pad placement is restricted to the free marginal areas. In some instances, therefore, the contact pads may lie in more or less uniform rows along the margins, and in other cases, the contact pads may be randomly spaced from each other.

Immediately following manufacture of the IC, the electrical characteristics of the device must be tested using a test probe assembly which includes a test probe card consisting of a printed circuit board having an opening therein to provide access to an IC pattern. The opening is surrounded by a ring of conductive pads connected by the printed circuit card to terminals for connection to test equipment appropriate for testing the circuit. The number of pads in the ring determines the maximum capacity of the probe card.

During testing of IC devices, the wafer on which the devices are fabricated is supported on a wafer chuck. Typically, the probe needles on the probe card are inclined relative to the bonding pads on the integrated circuit devices. After the probe needles have been aligned with the bonding pads, the wafer chuck is raised through an "over-travel distance" of approximately 3 mils past the point at which the probe tips first contact the pads, such that the typically inclined probe needles slide or "scrub" on the bonding pads of the die to allow optimum mechanical and electrical contact between the probe needles and the bonding pads.

A higher degree of integration in recent semiconductor devices has led to an increase in the number of electrodes in ICs and to a decrease in the size of the electrode pads which are contacted by the probe needles. The reduction in size and increase in density of the probe needles has inevitably made the manufacture and mounting of the needles on the probe card troublesome. The tips of the probe needles are ideally all disposed at the same height level and same angle, but these and other parameters of the needles fluctuate somewhat for a number of reasons. These variations in probe needle parameters reduce test precision and reliability.

In the course of manufacturing a probe card, the probe needles on the card are aligned with dots or targets imprinted on a needle alignment mask. The locations of the dots or targets correspond precisely to the bonding pads on the die to be probed. As stated above, during testing of integrated circuit die, the probe needles are "overdriven" by approximately 3 mils. This renders it necessary to provide the same 3 mils of overdrive during alignment of the probe needles with the dots on the mask.

As shown in FIG. 2, probe needle alignment is typically carried out on an alignment station 10, in which a needle alignment mask 12 is placed on a vertically-movable chuck 14 with alignment dots 13 on the mask 12 facing upwardly. A probe card 16 having probe needles 18 to be aligned is mounted securely in the alignment station 10, with the probe needles 18 pointing downwardly and as closely-aligned as possible with the respective dots 13 on the mask 12. A skilled operator then manipulates tweezers (not shown) to adjust the alignment of the probe needles 18 with respect to the dots 13. To accomplish this task, the operator views the probe needles 18 through a microscope (not shown). When the chuck 14 is raised to provide the 3 mil overdrive, the operator identifies the needles 18 which require bending or adjustment to be properly aligned with the corresponding dots on the mask 12. The mask 12 is then lowered such that it no longer contacts the needles 18. The operator then manipulates the tweezers to bend the misaligned needles 18, again raises the chuck 14 to the overdrive position, and determines whether the adjusted needles 18 are properly aligned with their respective dots 13 on the mask 12. If not, then the needles 18 are again manipulated to align the needles 18 with the dots 13 on the mask 12. This procedure is repeated until all of the needles 18 are properly aligned with the corresponding dots 13 on the mask 12 in the overdriven position. At that point, the probe card 16 is ready for use in testing dies on a wafer.

One of the problems associated with the conventional alignment station 10 is that certain types of probe cards are not amenable to probe needle alignment on the station 10. These include multi-DUT (Die Under Test), stagger-type probe cards in which the probe needles are arranged in a staggered configuration for contact with multiple rows of contact pads on a wafer. Accordingly, an alignment station is needed which is suitable for testing probe needles on a variety of different types of probe cards and which is characterized by enhanced alignment efficiency.

An object of the present invention is to provide a new and improved alignment station for aligning probe needles on a probe card.

Another object of the present invention is to provide a new and improved alignment station which may be used to align probe needles on multi-DUT, stagger-type probe cards.

Still another object of the present invention is to provide a new and improved alignment station in which probe needles on a probe card extend upwardly and are contacted with dots on a mask to ascertain whether the probe needles on the probe card are properly aligned for testing devices on a wafer.

Yet another object of the present invention is to provide a new and improved alignment station which includes a probe card support for receiving a probe card and a mask carrier which supports a needle alignment mask and is operable to selectively lower the mask into contact with the probe needles to ascertain whether the probe needles are properly aligned and raise the mask out of contact with the probe needles to facilitate alignment adjustment of the probe needles, as needed.

A still further object of the present invention is to provide a new and improved alignment station which is characterized by enhanced alignment efficiency.

Yet another object of the present invention is to provide a new and improved alignment station for aligning probe needles on a probe card, which alignment station is capable of selectively moving probe needles on a probe card into contact with alignment dots on a needle alignment mask and moving the probe card away from the alignment mask to facilitate proper alignment of the probe needles for subsequent testing of integrated circuits on a wafer.

SUMMARY OF THE INVENTION

In accordance with these and other objects and advantages, the present invention is generally directed to a new and improved alignment station for aligning probe needles on a probe card prior to testing of integrated circuits on a wafer. The alignment station includes a probe card support or chuck for receiving a probe card and mask carrier arms which support a needle alignment mask and are operable to selectively place the mask into contact with the probe needles and raise the mask out of contact with the probe needles. The alignment station is well-suited to probe cards having multi-DUT (Device Under Test), stagger-type probe needles and facilitates enhanced precision of alignment between alignment dots on a needle alignment mask and the probe needles on the probe card. The alignment station enables selective placement of the probe card into operable engagement with the mask and removal of the probe card from the mask to facilitate corrective adjustments in the alignment of the probe needles on the probe card, as needed.

BRIEF DESCRIPTION OF THE DRAWINGS

The invention will be better understood, by way of example, with reference to the accompanying drawings, in which.

DESCRIPTION OF THE PREFERRED EMBODIMENTS

The present invention is directed to a novel alignment station for the alignment of probe needles on a probe card in order to facilitate optimum contact between the probe needles and contact pads on a semiconductor wafer during the subsequent testing of integrated circuit dies on the wafer. The alignment station is well-suited to the alignment of probe needles on a variety of probe cards including those having multi-DUT (Device Under Test), stagger-type probe needles. The alignment station facilitates selective operable engagement of the probe needles on the probe card with alignment dots on a transparent glass needle alignment mask to ascertain whether the probe needles are properly aligned, and movement of the probe card away from the mask for making corrective adjustments in the alignments of the probe needles, as needed.

Figure 1:
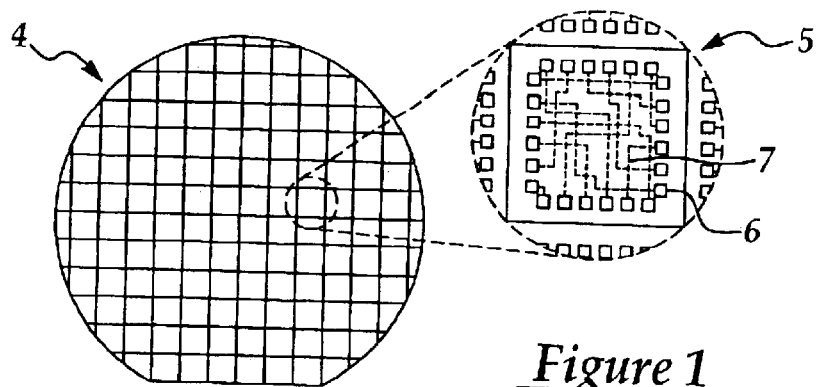
FIG. 1 is a top, partially schematic view of a semiconductor wafer with multiple dies fabricated thereon and an enlarged top view of a die on the wafer.
Figure 2:
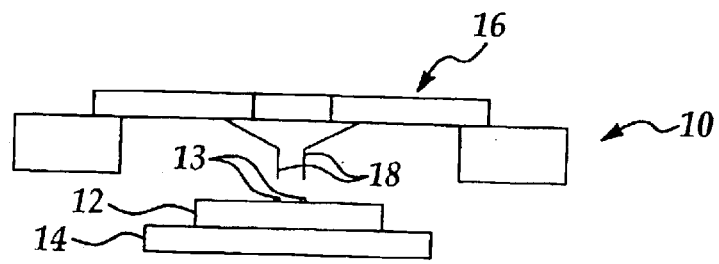
FIG. 2 is a schematic illustrating a typical conventional alignment station in the alignment of probe needles on a needle probe card.
Figure 3:
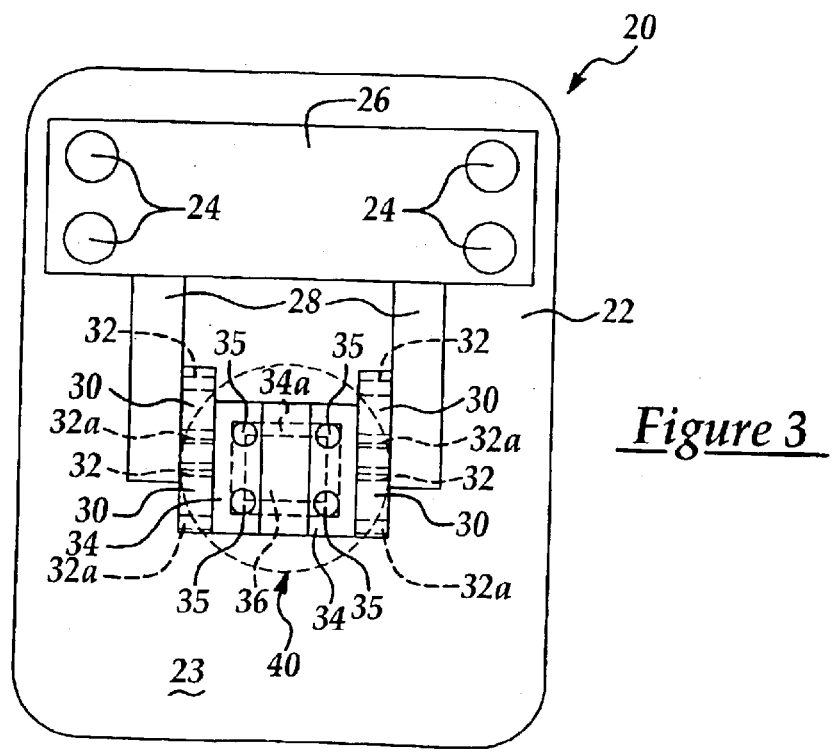
FIG. 3 is a top view of an alignment station of the present invention, with the microscope platform and microscope elements of the alignment station removed from the alignment station.
Figure 4:
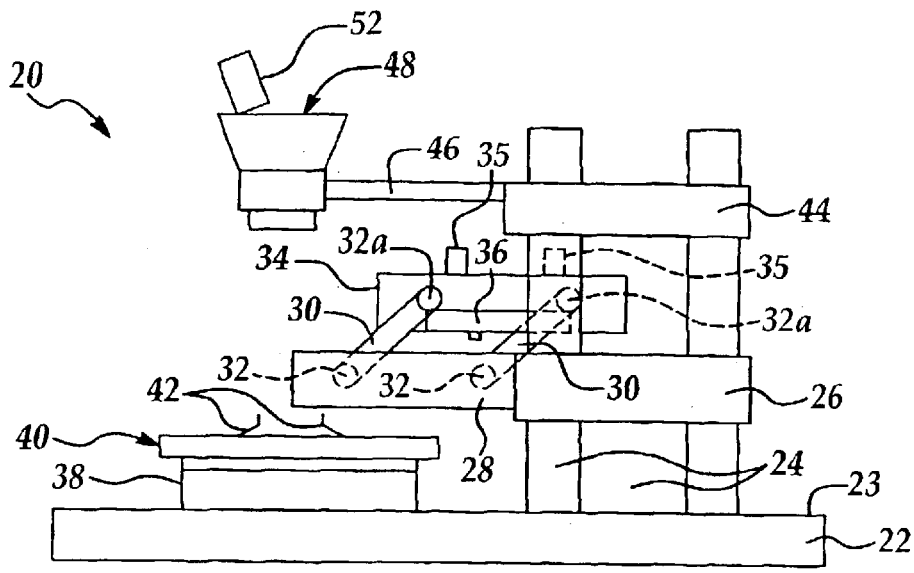
FIG. 4 is a side view of the alignment station, with a mask carrier arm element of the station and a needle alignment mask thereon positioned in a raised configuration with respect to a probe card for the corrective alignment of probe needles on the probe card.
Figure 5:
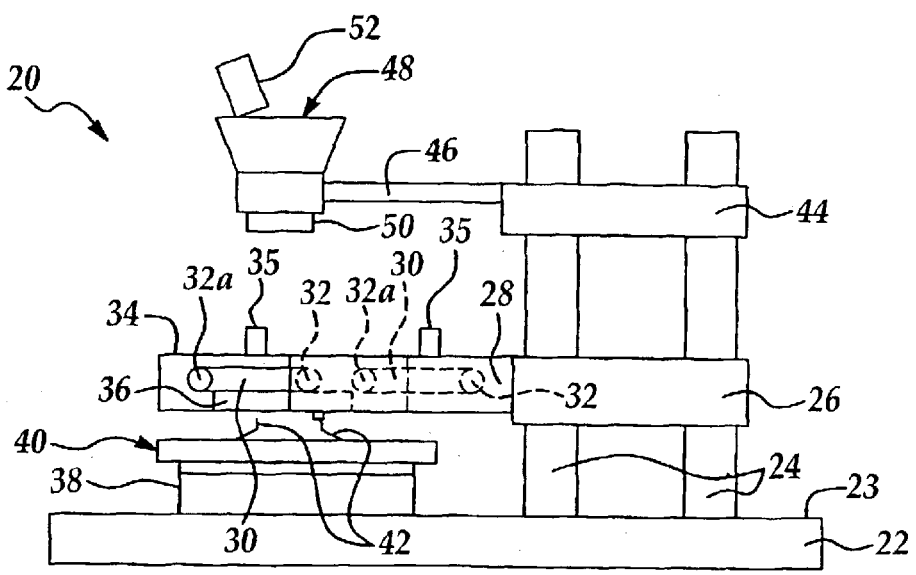
FIG. 5 is a side view of the alignment station, with the mask carrier arms and needle alignment mask positioned in a lowered, functional configuration with respect to a probe card to ascertain whether probe needles on the probe card are properly aligned.

Referring to FIGS. 3–5, an illustrative embodiment of the alignment station of the present invention is generally indicated by reference numeral 20. The alignment station 20 includes a flat base 22 which typically has a generally elongated, rectangular configuration. As shown in FIG. 3, two pairs of adjacent, parallel platform supports 24 extend upwardly from the upper surface 23 of the base 22, in spaced-apart relationship to each other typically at one end of the base 22. A typically elongated, rectangular mask carrier platform 26 is horizontally mounted on both pairs of adjacent platform supports 24, with each pair of platform supports 24 located at a corresponding end of the mask carrier platform 26, as further shown in FIG. 3. A pair of substantially parallel, adjacent platform support arms 28 extends horizontally and typically in cantilever fashion from the mask carrier platform 26. As shown in FIGS. 4 and 5, a probe card support or chuck 38 is mounted on the upper surface 23 of the base 22, beneath and between the platform support arms 28. In operation of the alignment station 20 as hereinafter described, the chuck 38 is operable to receive and support an inverted probe card 40 having multiple, upwardly-extending probe needles 42. In a preferred embodiment, the chuck 38 is capable of raising and lowering the probe card 40 with respect to the upper surface 23 of the base 22.

As further shown in FIG. 3, a pair of elongated bearing arms 30 is pivotally mounted on the inner surface of each platform support arm 28. The proximal end of each bearing arm 30 of each bearing arm pair is pivotally attached to the corresponding platform support arm 28 via a proximal pivot pin 32. A mask carrier arm 34 is pivotally attached to the distal end of each bearing arm 30 via a distal pivot pin 32a. Thus, the two bearing arms 30 on each platform support arm 28 are attached to a corresponding mask carrier arm 34. In operation of the alignment station 20 as hereinafter described, a typically glass, transparent needle alignment mask 36 having multiple alignment dots 37 is mounted between the mask carrier arms 34, in a manner to be hereinafter described, to facilitate alignment of the probe needles 42 on the probe card 40 as the probe card 40 rests on the chuck 38, with the alignment dots 37. Accordingly, the mask carrier arms 34 are pivotally mounted to the respective platform support arms 28 in such a manner that the mask carrier arms 34 and the needle adjustment mask 36 are capable of being positioned in the lowered, functional configuration of FIG. 5, wherein the bearing arms 30 are disposed in a horizontal position and the needle alignment mask 36 is disposed in functional contact with the probe card 40; and the raised, non-functional configuration of FIG. 4, wherein the bearing arms 30 are disposed in an upwardly- and rearwardly-angled position and the needle alignment mask 36 is positioned away from the probe card 40 to provide access to the probe needles 42 on the probe card 40 for corrective alignment of the probe needles 42, as needed. It is understood that the pair of mask carrier arms 34 may be of a unitary piece to define a single mask carrier, opposite sides of which are pivotally attached to the respective platform support arms 28 via the respective pairs of bearing arms 30.

Figure 4A:
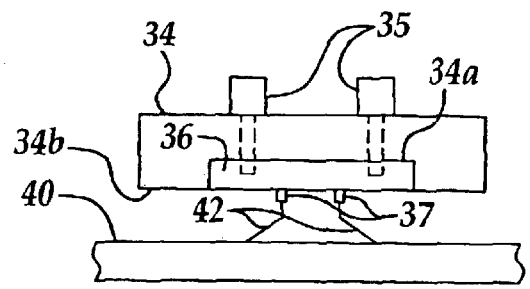
FIG. 4A is a side view of a mask carrier arm element of the alignment station, with probe needles on a probe card disposed in contact with alignment dots on a needle alignment mask provided on the mask carrier arms.

As shown in FIGS. 3 and 4A, a mask recess 34a is provided in the bottom surface 34b of each mask carrier arm 34. The needle alignment mask 36, which may be conventional, is typically removably mounted in each mask recess 34a. In a preferred embodiment, the needle alignment mask 36 is mounted in the mask recess 34a of each mask carrier arm 34 by extending screws 35 through respective screw openings (not shown) extending through the mask carrier arm 34 and threading the screws 35 into respective screw openings (not shown) provided in the needle alignment mask 36. However, it is understood that other techniques known by those skilled in the art may be used to mount the needle alignment mask 36 on the mask carrier arms 34.

As shown in FIGS. 4 and 5, an elongated, typically rectangular microscope platform 44 is horizontally mounted on the platform supports 24, above the mask carrier platform 26. A microscope support arm 46 extends horizontally from the microscope platform 44, above the chuck 38. A microscope 48, which may be conventional, is mounted on the extending or distal end of the microscope support arm 46 and typically includes one or more lenses 50 of selected power and an eyepiece or eyepieces 52. The microscope 48 is used to view the probe needles 42 on the probe card 40 as the probe card 40 rests on the chuck 38 and the probe needles 42 are aligned with the respective alignment dots 37 on the needle alignment mask 36, as hereinafter further described.

In typical operation of the alignment station 20, the mask carrier arms 34 are initially positioned in the raised configuration on the platform support arms 28, as shown in FIG. 4. A probe card 40 which is to be subsequently used in the testing of integrated circuits on a semiconductor wafer (not shown) is then placed on the chuck 38 in the inverted position, with the multiple probe needles 42 of the probe card 40 extending upwardly, as shown in FIG. 4. The backside of the probe card 40 may be secured to the chuck 38 electrostatically or according to other techniques known by those skilled in the art. A needle alignment mask 36, which is typically transparent glass, is then mounted in the mask recesses 34a of the respective mask carrier arms 34, typically by threading the screws 35 into the respective screw openings (not shown) in the needle alignment mask 36. The needle alignment mask 36 includes multiple alignment dots 37, the positions of which correspond to the positions of the contact pads of the integrated circuit die to subsequently be tested using the probe card 40.

After the probe card 40 has been properly positioned on the chuck 38, the mask carrier arms 34, with the needle alignment mask 36 mounted thereon, are lowered from the raised, non-functional position of FIG. 4 to the lowered, functional position of FIG. 5. This is accomplished typically by manually pivoting the mask carrier arms 34 on the bearing arms 30. The chuck 38 is then operated to slowly raise the probe card 40 in such a manner that the probe needles 42 contact the needle alignment mask 36. To determine whether the probe needles 42 are properly aligned with the respective alignment dots 37 on the needle alignment mask 36, an operator (not shown) views the probe needles 42 through the microscope 48 and the portion of the transparent needle alignment mask 36 which extends between the mask carrier arms 34. While most of the multiple alignment dots 37 on the needle alignment mask 36 are typically initially disposed in general alignment with the respective probe needles 42 on the probe card 40, raising of the probe needles 42 into contact with the needle alignment mask 36 usually reveals that most or all of the probe needles 42 require corrective positional adjustments to more precisely align the probe needles 42 with the alignment dots 37. Accordingly, most or all of the probe needles 42 on the probe card 40 must typically be mechanically manipulated in order to be properly aligned with the respective alignment dots 37. To accomplish this end, a corrective probe needle alignment procedure is typically carried out by the operator, who first removes the probe needles 42 from contact with the needle alignment mask 36 by lowering the probe card 40 on the chuck 38 and then manually raises the mask carrier arms 34 and attached needle alignment mask 36 from the lowered position of FIG. 5 to the raised position of FIG. 4. This provides access to the probe needles 42 for unhindered corrective adjustments thereof. Accordingly, the operator manipulates the probe needles 42, typically using tweezers (not shown) or like instrumentation, in an effort to achieve more precise alignment of the probe needles 42 with the respective alignment dots 37, typically in conventional fashion. The operator typically views the probe needles 42 through the microscope 48 to achieve more precise three-dimensional manipulation of the probe needles 42. After the probe needles 42 have been so manipulated, the operator lowers the mask carrier arms 34 and attached needle alignment mask 36 back to the lowered position of FIG. 5 and raises the probe needles 42 back into contact with the needle alignment mask 36 to observe the degree of alignment of the positionally-adjusted probe needles 42 with the respective alignment dots 37. In the event that further manipulation of the probe needles 42 is deemed necessary to achieve proper alignment and contact of the probe needles 42 with the respective alignment dots 37, the mask carrier arms 34 and mask 36 are again raised to the position of FIG. 4 for further manipulation of the probe needles 42. This procedure is repeated as many times as is necessary until all of the probe needles 42 on the probe card 40 are properly aligned, as revealed by their contact with the respective alignment dots 37 on the needle alignment mask 36. At that point, the probe card 40 may be removed from the chuck 38 and used to test the integrated circuit die on the wafer to be tested, according to the knowledge of those skilled in the art.

While the preferred embodiments of the invention have been described above, it will be recognized and understood that various modifications can be made to the invention and the appended claims are intended to cover all such modifications which may fall within the spirit and scope of the invention.

What is claimed is:

1. An alignment station for aligning probe needles on a probe card, comprising:
   a support for receiving the probe card;
   a platform support arm disposed above and adjacent to said support;
   a mask carrier pivotally carried by said platform support arm for receiving a needle alignment mask; and
   wherein said mask carrier is positional between a lowered configuration for positioning the needle alignment mask into contact with the probe needles and a raised configuration for moving the needle alignment mask away from the probe needles.

2. The alignment station of claim 1 further comprising a second platform support arm disposed above and adjacent to said support opposite said platform support arm and wherein said mask carrier comprises first and second mask carrier arms pivotally carried by said platform support arm and said second platform support arm, respectively.

3. The alignment station of claim 1 further comprising a microscope disposed above said support.

4. The alignment station of claim 3 further comprising a second platform support arm disposed above and adjacent to said support opposite said platform support arm and wherein said mask carrier comprises first and second mask carrier arms pivotally carried by said platform support arm and said second platform support arm, respectively.

5. The alignment station of claim 1 further comprising a pair of bearing arms each having a proximal end pivotally carried by said platform support arm and a distal end pivotally carried by said mask carrier for pivotally mounting said mask carrier on said platform support arm.

6. The alignment station of claim 5 further comprising a second platform support arm disposed above and adjacent to said support opposite said platform support arm and wherein said mask carrier comprises first and second mask carrier arms pivotally carried by said platform support arm and said second platform support arm, respectively, and said pair of bearing arms pivotally attaches said first mask carrier arm to said platform support arm; and further comprising a second pair of bearing arms each having a proximal end pivotally carried by said second platform support arm and a distal end carried by said second mask carrier arm for pivotally mounting said second mask carrier arm on said second platform support arm.

7. The alignment station of claim 5 further comprising a microscope disposed above said support.

8. The alignment station of claim 7 further comprising a second platform support arm disposed above and adjacent to said support opposite said platform support arm and wherein said mask carrier comprises first and second mask carrier arms pivotally carried by said platform support arm and said second platform support arm, respectively, and said pair of bearing arms pivotally attaches said first mask carrier arm to said platform support arm; and further comprising a second pair of bearing arms each having a proximal end pivotally carried by said second platform support arm and a distal end carried by said second mask carrier arm for pivotally mounting said second mask carrier arm on said second platform support arm.

9. An alignment station for aligning probe needles on a probe card, comprising:
   a base;
   a support carried by said base for receiving the probe card;
   a mask carrier pivotally supported by said base for receiving a needle alignment mask; and
   wherein said mask carrier is positional between a lowered configuration for positioning the needle alignment mask into contact with the probe needles and a raised configuration for moving the needle alignment mask away from the probe needles.

10. The alignment station of claim 9 further comprising first and second platform support arms carried by said base and disposed above and on opposite sides of said support and wherein said mask carrier is pivotally carried by said first and second platform support arms.

11. The alignment station of claim 9 further comprising a microscope carried by said base above said support.

12. The alignment station of claim 11 further comprising first and second platform support arms carried by said base and disposed above and on opposite sides of said support and wherein said mask carrier is pivotally carried by said first and second platform support arms.

13. The alignment station of claim 10 further comprising a first pair of bearing arms each having a proximal end pivotally carried by said first platform support arm and a distal end pivotally carried by said mask carrier for pivotally mounting said mask carrier on said platform support arm, and a second pair of bearing arms each having a proximal end pivotally carried by said second platform support arm and a distal end pivotally carried by said mask carrier for pivotally mounting said mask carrier on said second platform support arm.

14. The alignment station of claim 13 further comprising a microscope carried by said base above said support.

15. The alignment station of claim 13 wherein said mask carrier comprises a first mask carrier arm pivotally carried by said first pair of bearing arms and a second mask carrier arm pivotally carried by said second pair of bearing arms.

16. The alignment station of claim 15 further comprising a microscope carried by said base above said support.

17. An alignment station for aligning probe needles on a probe card, comprising:

a base;

a support carried by said base for receiving the probe card;

a mask carrier platform carried by said base;

a mask carrier pivotally carried by said mask carrier platform for receiving a needle alignment mask; and wherein said mask carrier is positional between a lowered configuration for positioning the needle alignment mask into contact with the probe needles and a raised configuration for moving the needle alignment mask away from the probe needles.

18. The alignment station of claim 17 further comprising a microscope platform carried by said base above said mask carrier platform and a microscope carried by said microscope platform above said support.

19. The alignment station of claim 17 further comprising first and second platform support arms carried by said mask carrier platform and disposed above and on opposite sides of said support and wherein said mask carrier comprises first and second mask carrier arms pivotally carried by said first and second platform support arms, respectively.

20. The alignment station of claim 19 further comprising a first pair of bearing arms each having a proximal end pivotally carried by said first platform support arm and a distal end pivotally carried by said first mask carrier arm for pivotally mounting said first mask carrier arm on said first platform support arm, and a second pair of bearing arms each having a proximal end pivotally carried by said second platform support arm and a distal end pivotally carried by said second mask carrier arm for pivotally mounting said second mask carrier arm on said second platform support arm.

* * * * *